United States Patent
Wang

(10) Patent No.: US 9,793,465 B2
(45) Date of Patent: Oct. 17, 2017

(54) ULTRASONIC SENSOR UTILIZING CHEMICALLY STRENGTHENED GLASS AS SUBSTRATE

(71) Applicant: MiiCs & Partners Inc., Road Town (VG)

(72) Inventor: Juan Wang, Shenzhen (CN)

(73) Assignee: MiiCs & Partners Inc., Road Town (VG)

( * ) Notice: Subject to any disclaimer, the term of this patent is extended or adjusted under 35 U.S.C. 154(b) by 510 days.

(21) Appl. No.: 14/555,719

(22) Filed: Nov. 28, 2014

(65) Prior Publication Data

US 2016/0149116 A1    May 26, 2016

(30) Foreign Application Priority Data

Nov. 24, 2014  (CN) .......................... 2014 1 0678994

(51) Int. Cl.
| | | |
|---|---|---|
| *H01L 41/113* | (2006.01) | |
| *H01L 41/053* | (2006.01) | |
| *G06K 9/00* | (2006.01) | |
| *H01L 41/047* | (2006.01) | |
| *H01L 41/193* | (2006.01) | |

(52) U.S. Cl.
CPC ........ *H01L 41/1132* (2013.01); *G06K 9/0002* (2013.01); *H01L 41/0477* (2013.01); *H01L 41/0478* (2013.01); *H01L 41/0533* (2013.01); *H01L 41/193* (2013.01)

(58) Field of Classification Search
CPC . G06K 9/002; H01L 41/1132; H01L 41/0477; H01L 41/0478; H01L 41/0533; H01L 41/193
USPC .......................... 310/322, 334, 340, 366, 338
See application file for complete search history.

(56) References Cited

U.S. PATENT DOCUMENTS

| | | | |
|---|---|---|---|
| 2015/0189051 A1* | 7/2015 | Umehara ............ | H04M 1/0202 455/566 |
| 2016/0163958 A1* | 6/2016 | Park .................... | H01L 41/1132 310/365 |

* cited by examiner

*Primary Examiner* — Thomas Dougherty
(74) *Attorney, Agent, or Firm* — Steven Reiss

(57) ABSTRACT

An ultrasonic sensor includes a first electrode, a first piezoelectric layer, a substrate, a second electrode, a second piezoelectric layer, and a third electrode. The first electrode and the first piezoelectric layer are stacked on a first surface of the substrate. The second electrode, the second piezoelectric layer, and the third electrode are stacked on a second surface opposite to the first surface of the substrate. The substrate is made of chemically strengthened glass.

19 Claims, 7 Drawing Sheets

ULTRASONIC SENSOR UTILIZING CHEMICALLY STRENGTHENED GLASS AS SUBSTRATE

CROSS-REFERENCE TO RELATED APPLICATIONS

This application claims priority to Chinese Patent Application No. 201410678994.2 filed on Nov. 24, 2014 in the Chinese Intellectual Property Office, the contents of which are incorporated by reference herein.

FIELD

Embodiments of the present disclosure generally relate to ultrasonic sensors, and more particularly, to an ultrasonic sensor utilizes a chemical strengthen glass as a substrate.

BACKGROUND

Ultrasonic sensors has been widely used in industry, national defense, fire protection, electronics and other different fields the like. A typical kind of ultrasonic sensors are ultrasonic fingerprint sensors used in electronic devices such as smart phones or tablet computers. Ultrasonic sensors are also known as transceivers or transducers which work on a principle similar to radar or sonar, which evaluate attributes of a target by interpreting the echoes from radio or sound waves respectively. The ultrasonic sensors can generate high frequency sound waves and evaluate the echo which is received back by the sensor. For example, the sensors can measure the time interval between sending the signal and receiving the echo to determine the distance to an object.

BRIEF DESCRIPTION OF THE DRAWINGS

Implementations of the present technology will now be described, by way of example only, with reference to the attached figures.

DETAILED DESCRIPTION

Figure 1:
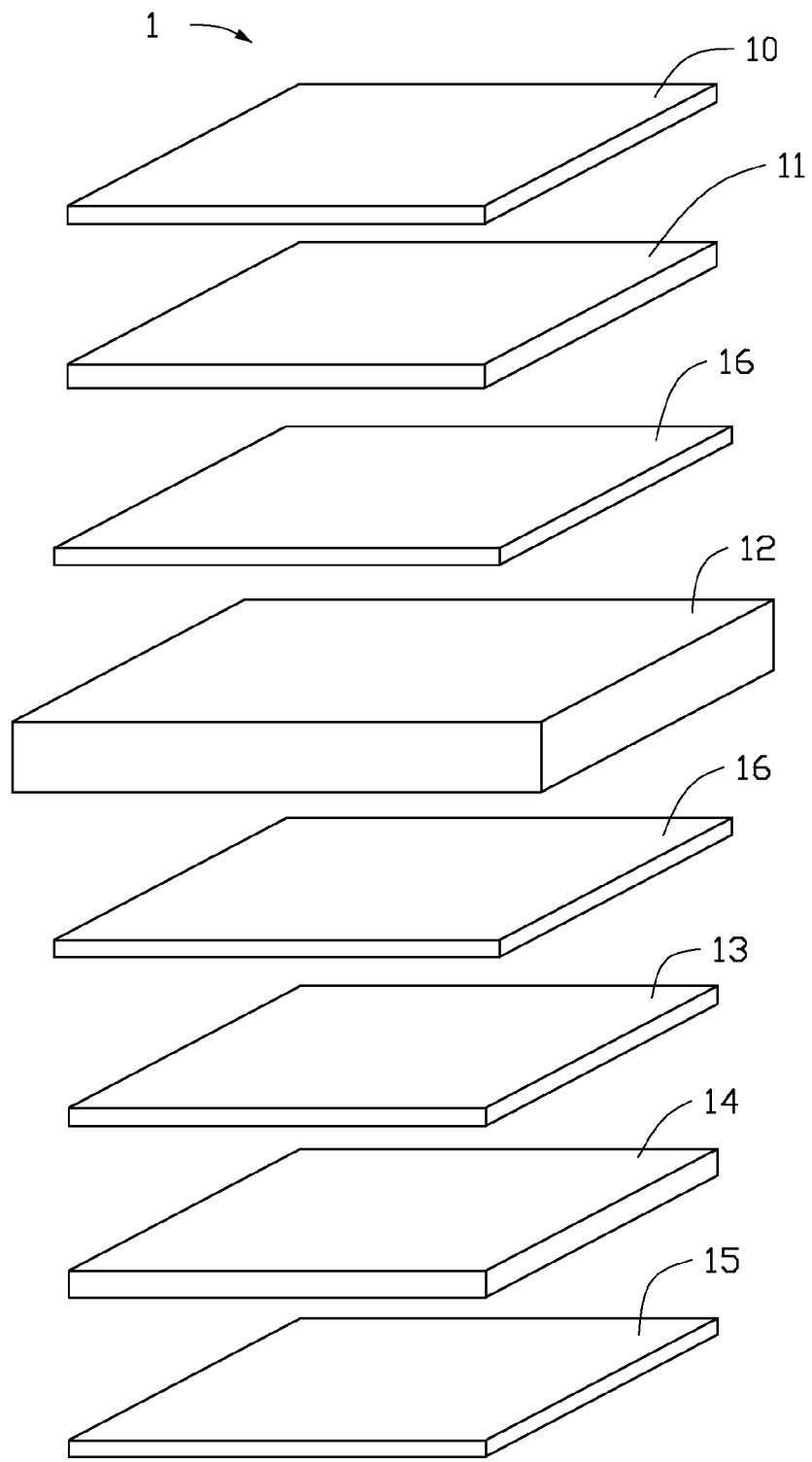
FIG. 1 is an exploded view of an ultrasonic sensor according to a first embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "coupled" is defined as connected, whether directly or indirectly through intervening components, and is not necessarily limited to physical connections. The connection can be such that the objects are permanently connected or releasably connected.

The present disclosure is described in relation to an ultrasonic sensor utilizing a chemically strengthened glass as a substrate.

Figure 2:
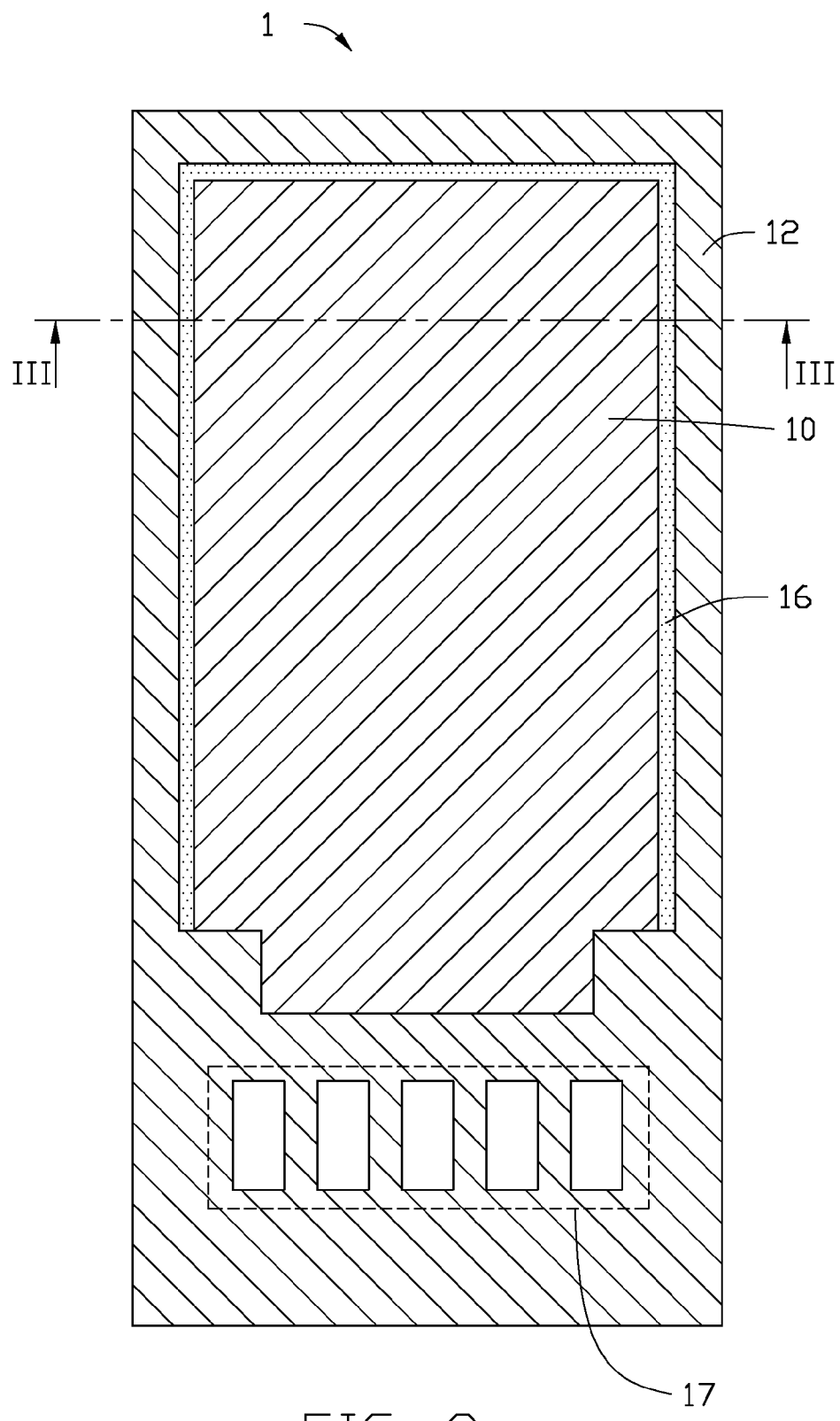
FIG. 2 is a plan view of the ultrasonic sensor of FIG. 1.
Figure 3:
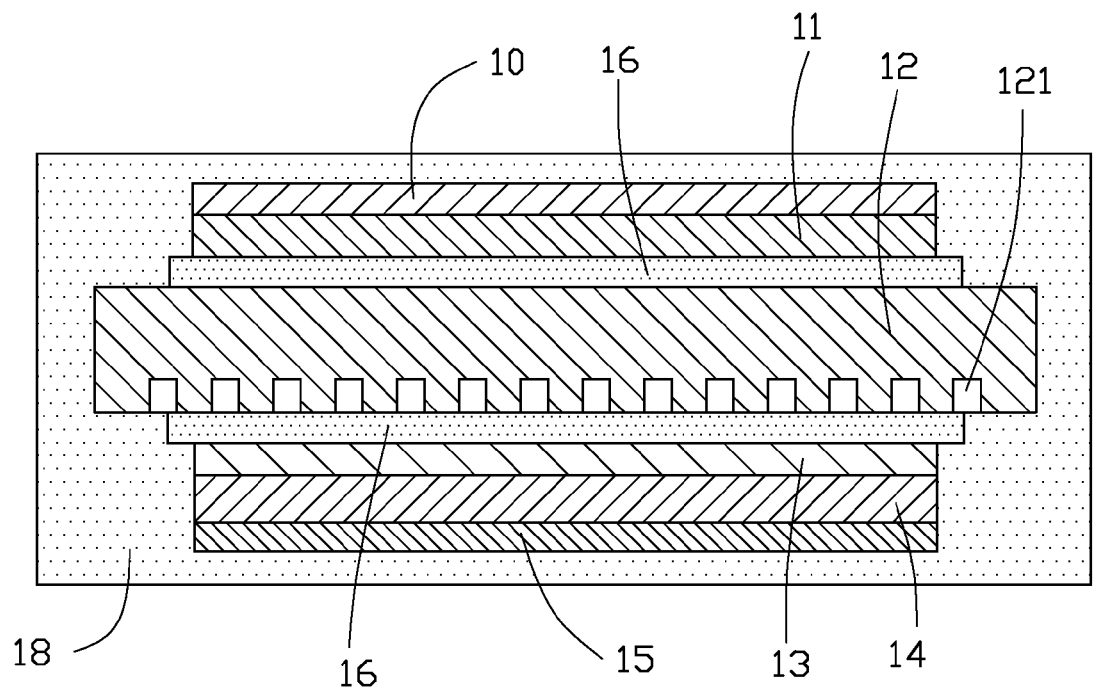
FIG. 3 is a cross-sectional view of the ultrasonic sensor taken along line II-II of FIG. 2.

Referring to FIG. 1 to FIG. 3, FIG. 1 shows an exploded view of an ultrasonic sensor 1 according to a first embodiment, FIG. 2 shows a plan view of the ultrasonic sensor 1 of FIG. 1, and FIG. 3 shows a cross-sectional view of the ultrasonic sensor 1 taken along line II-II of FIG. 2. In at least one embodiment, the ultrasonic sensor 1 can be an ultrasonic fingerprint sensor applied to electronic devices to sense user fingerprints. The ultrasonic sensor 1 can include a first electrode 10, a first piezoelectric layer 11, a substrate 12, a second electrode 13, a second piezoelectric layer 14, and a third electrode 15. The first electrode 10, the first piezoelectric layer 11, the substrate 12, the second electrode 13, the second piezoelectric layer 14, and the third electrode 15 are stacked along a vertical orientation in order to form the ultrasonic sensor 1. A plurality of thin film transistor (TFT) 121 are located on the substrate 12 to receive and process signals.

The first electrode 10 is attached on a first surface of the first piezoelectric layer 11 away from the substrate 12. In at least one embodiment, the first electrode 10 can be made of metal materials having good performance of conductivity. For example, some non-limited examples of the metal materials comprise silver (Ag), aluminum (Al), copper (Cu), nickel (Ni), aurum (Au). In other embodiments, the first electrode 10 can be made of transparent conductive materials. Some non-limited examples of the transparent conductive materials comprise indium tin oxide (ITO), zinc oxide (Zno), poly(3,4-ethylenedioxiythiophene) (PEDOT), carbon nanotude (CNT), Ag nanowire, and graphene. In a preferred embodiment, the first piezoelectric layer 11 can be a piezoelectric film made of piezoelectric materials such as polyvinylidene fluoride (PVDF).

The first electrode 10 can be attached on the first surface of the first piezoelectric layer 11 by a vacuum sputtering method, an electroplating method, or a coating method. A preferred method of forming the first electrode 10 on the first surface of the first piezoelectric layer 11 is the electroplating method. For example, a large area of the first surface of the first piezoelectric layer 11 can be electroplated to form an electroplating layer. The electroplating layer formed on the first surface of the first piezoelectric layer 11 is the first electrode 10. The first electrode 10 is an ultrathin conductive film having a good sound pressure sensitivity. A thickness of the first electrode is in a range from about 400 angstrom to about 1000 angstrom.

The first piezoelectric layer 11 can be attached to a first surface of the substrate 12 by an adhesive layer 16. Materials of the adhesive layer 16 can be liquid adhesive, double sided adhesive tape, or optical adhesive. In a preferred embodiment, the adhesive layer 16 is made of the optical adhesive such as optical clear adhesive (OCA) or optical clear resin (OCR).

The second electrode 13 and the third electrode 15 are respectively attached on two opposite surfaces of the second piezoelectric layer 14. In at least one embodiment, the second piezoelectric layer 14 can be a piezoelectric film made of piezoelectric materials such as polyvinylidene fluoride (PVDF). One surface of the second electrode 13 is attached to the second piezoelectric layer 14, and another surface of the second electrode 13 away from the piezoelectric layer 14 is attached to a second surface of the substrate 12 away from the first piezoelectric layer 11.

In at lease one embodiment, both the second electrode 13 and the third electrode 15 can be made of metal materials having good performance of conductivity. For example, some non-limited examples of the metal materials comprise silver (Ag), aluminum (Al), copper (Cu), nickel (Ni), aurum (Au). In other embodiments, the second electrode 13 and the third electrode 15 can be made of transparent conductive materials. Some non-limited examples of the transparent conductive materials comprise indium tin oxide (ITO), zinc oxide (Zno), poly(3,4-ethylenedioxiythiophene) (PEDOT), carbon nanotude (CNT), Ag nanowire, and graphene.

In addition, the second electrode 13 and the third electrode 15 can be made of different materials. For example, the second electrode 13 is made of metal materials, while the third electrode 15 is made of transparent conductive materials. In another example, the second electrode 13 is made of transparent conductive materials, while the third electrode 15 is made of metal materials. Preferably, both the second electrode 13 and the third electrode 15 are made of silver (Ag).

The second electrode 13 and the third electrode 15 can be respectively attached to the opposite surfaces of the second piezoelectric layer 14 by a vacuum sputtering method, an electroplating method, or a coating method. A preferred method of forming second electrode 13 and the third electrode 15 is the electroplating method. For example, a large area of the both opposite surfaces of the second piezoelectric layer 14 can be electroplated to form two opposite electroplating layers on the two opposite surfaces of the second piezoelectric layer 14. The two electroplating layers formed on the two opposite surfaces of the second piezoelectric layer 14 respectively are the second electrode 13 and the third electrode 15. Each of the second electrode 13 and the third electrode 15 is an ultrathin conductive film having a good sound pressure sensitivity. A thickness of the second electrode 13 and the third electrode 15 is in a range from about 400 angstrom to about 1000 angstrom.

In at least one embodiment, the second electrode 13 and the third electrode 15 are configured to apply voltage to the second piezoelectric layer 14. The second piezoelectric layer 14 serves as a signal sending layer (Tx) and generate sound waves when the voltage is received from the second electrode 13 and the third electrode 15. The sound waves can be ultrasonic waves. When an external object presses or is close to the ultrasonic sensor 1, the ultrasonic waves will arrive at the external object and will be reflected by the external object. The first piezoelectric layer 11 serves as a signal receiving layer (Rx) to receive the ultrasonic waves reflected from the external object, and coverts the ultrasonic waves into electric signals. The electric signals are transmitted to the thin film transistors 121 of the substrate 12. Then, the electric signals are processed by the thin film transistors 121 to realize specific functions such as fingerprint recognition functions of the ultrasonic sensor 1.

In the embodiment, the substrate 12 is different from the traditional TFT glass substrate. The substrate 12 is made of chemically strengthened (CS) glass. For example, the substrate 12 can be made of sodium glass and aluminum silicate glass. The CS glass can be chemically strengthened by a surface finishing process. For example, the glass can be submersed into a bath containing a high purity potassium salt (typically potassium nitrate) solution and catalyst at a high temperature (e.g., 300° C., 420° C., or 450° C.) condition. This causes sodium ions in the glass surface to be replaced by potassium ions from the bath solution to form a strengthened layer on the surface of the glass. In at least one embodiment, the surface compression of the chemically strengthened glass exceeds 200 MPa, and a depth of layer (DOL) of the chemically strengthened glass exceeds five micrometer (µm).

The ultrasonic sensor 1 further includes a electric connector 17 located on the substrate 12 and configured to couple with an external control circuit (such as flexible printed circuit, FPC). The first electrode 10, the second electrode 13, and the third electrode 15 can be electrically coupled to the external control circuit via the electric connector 17. The external control circuit can supply power to the first electrode 10, the second electrode 13, and the third electrode 15 via the electric connector 17, and can exchange data or signals with the first electrode 10, the second electrode 13, and the third electrode 15 via the electric connector 17.

Further, an encapsulation layer 18 is coated on an external surface of the ultrasonic sensor 17 to encapsulate and protect the ultrasonic sensor 1. In at least one embodiment, the encapsulation layer 18 is formed of adhesive materials, such as glues, resins, optical adhesives, or compound adhesives. A thickness of the encapsulation layer 18 is greater than 10 µm.

Figure 4:
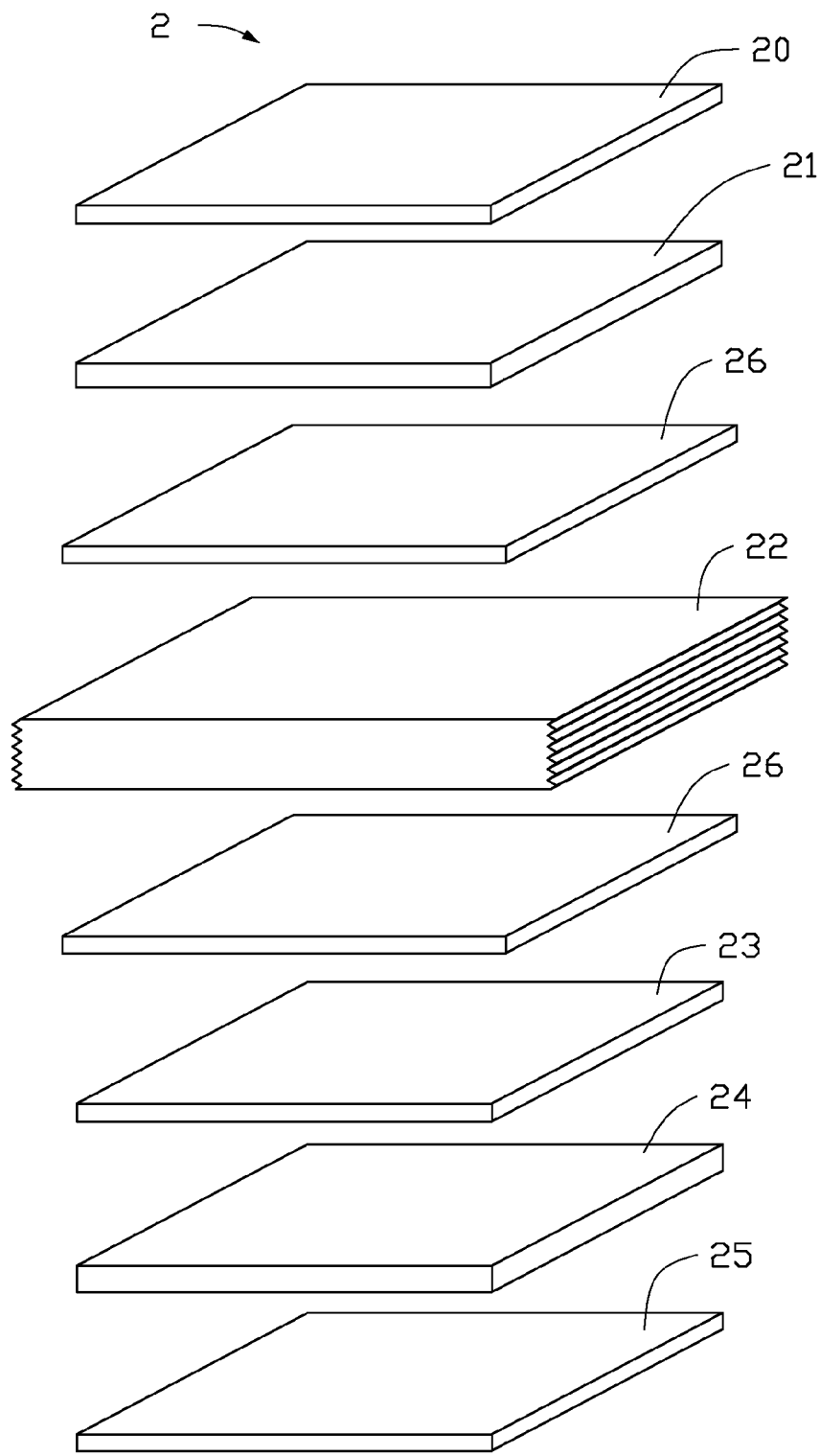
FIG. 4 is an exploded view of an ultrasonic sensor according to a second embodiment.
Figure 5:
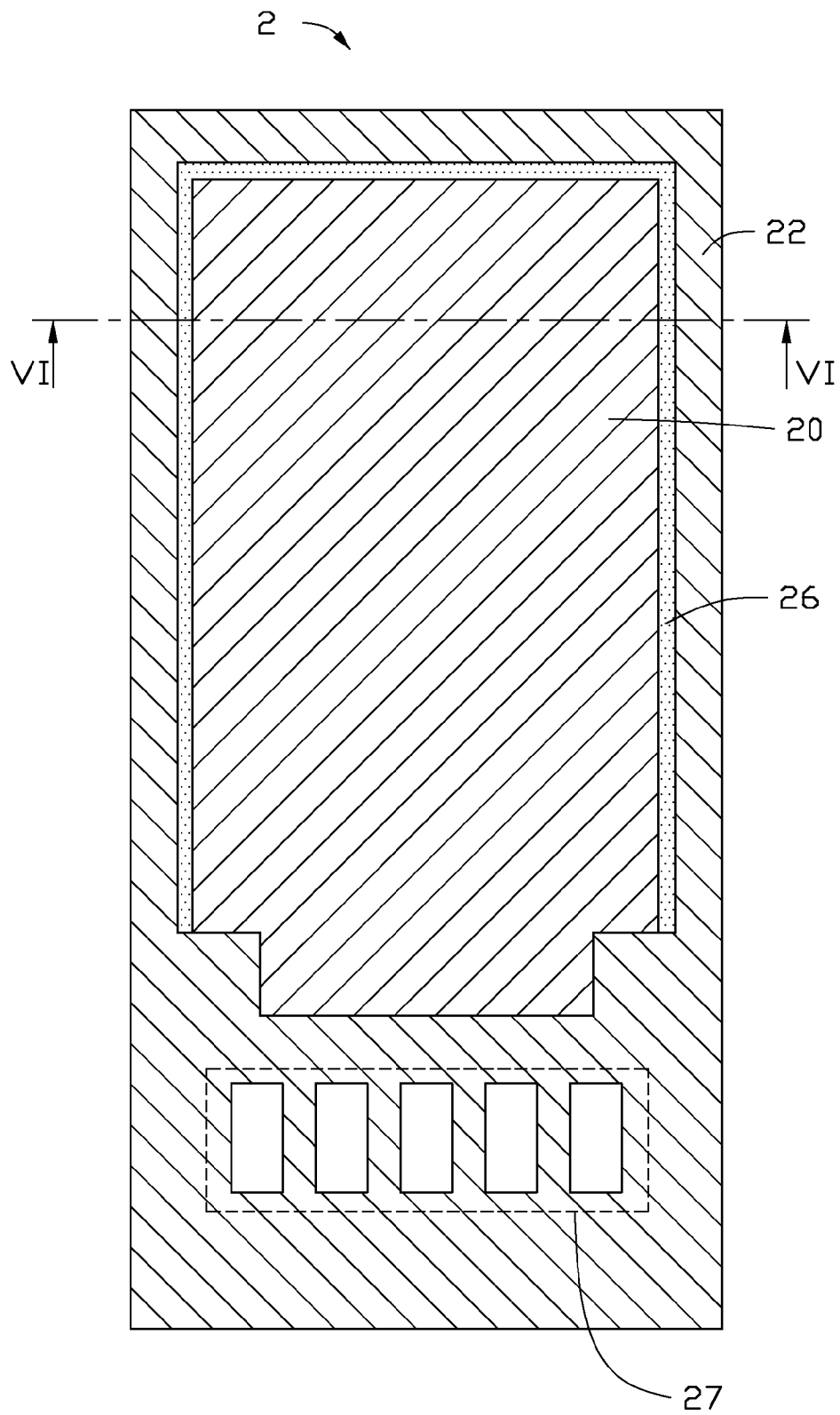
FIG. 5 is a plan view of the ultrasonic sensor of FIG. 4.
Figure 6:
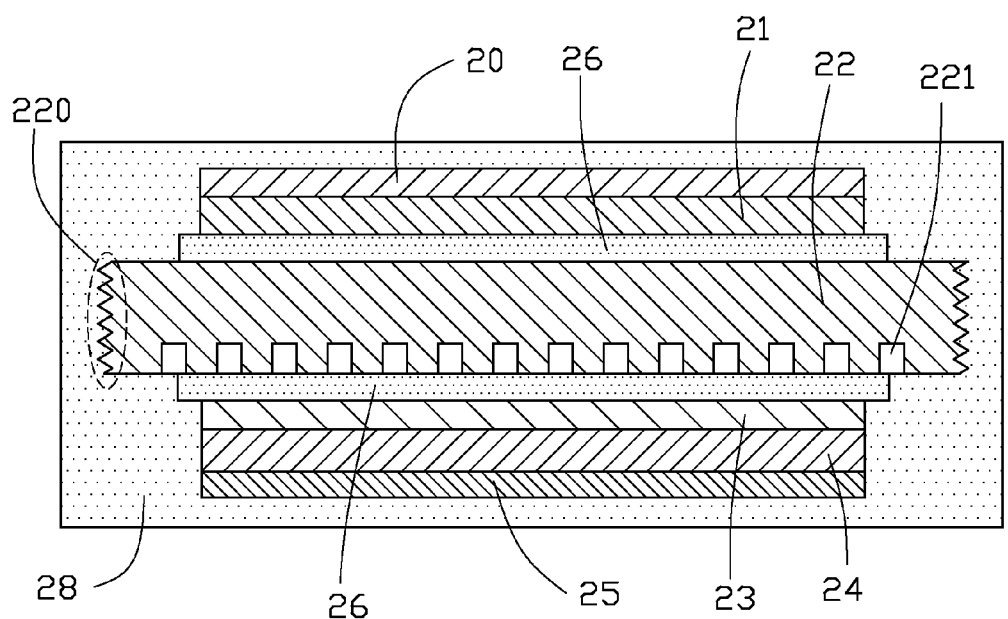
FIG. 6 is a cross-sectional view of the ultrasonic sensor taken along line V-V of FIG. 5.

Referring to FIG. 4 to FIG. 6, FIG. 4 shows an exploded view of an ultrasonic sensor 2 according to a second embodiment, FIG. 5 shows a plan view of the ultrasonic sensor 2 of FIG. 5, and FIG. 6 shows a cross-sectional view of the ultrasonic sensor 2 taken along line V-V of FIG. 5. In the embodiment, the ultrasonic sensor 2 can be an ultrasonic fingerprint sensor applied to electronic devices to sense user fingerprints. The ultrasonic sensor 2 can include a first electrode 20, a first piezoelectric layer 21, a substrate 22, a second electrode 23, a second piezoelectric layer 24, and a third electrode 25. The first electrode 20, the first piezoelectric layer 21, the substrate 22, the second electrode 23, the second piezoelectric layer 24, and the third electrode 25 are stacked along a vertical orientation in order to form the ultrasonic sensor 2. A plurality of thin film transistor (TFT) 221 are located on the substrate 22 to receive and process signals.

The first electrode 20 is attached on a first surface of the first piezoelectric layer 21 away from the substrate 22. In the embodiment, the first electrode 20 can be made of metal materials having good performance of conductivity. For example, some non-limited examples of the metal materials comprise silver (Ag), aluminum (Al), copper (Cu), nickel (Ni), aurum (Au). In other embodiments, the first electrode 20 can be made of transparent conductive materials. Some non-limited examples of the transparent conductive materials comprise indium tin oxide (ITO), zinc oxide (Zno), poly(3,4-ethylenedioxiythiophene) (PEDOT), carbon nanotude (CNT), Ag nanowire, and graphene. In a preferred embodiment, the first piezoelectric layer 21 can be a piezoelectric film made of piezoelectric materials such as polyvinylidene fluoride (PVDF).

The first electrode 20 can be attached on the first surface of the first piezoelectric layer 21 by a vacuum sputtering method, an electroplating method, or a coating method. A preferred method of forming the first electrode 20 on the first surface of the first piezoelectric layer 21 is the electroplating method. For example, a large area of the first surface of the first piezoelectric layer 21 can be electroplated to form an electroplating layer. The electroplating layer formed on the first surface of the first piezoelectric layer 21 is the first electrode 20. The first electrode 20 is an ultrathin conductive film having a good sound pressure sensitivity. A thickness of the first electrode is a range from about 400 angstrom to about 1000 angstrom.

The first piezoelectric layer 21 can be attached to a first surface of the substrate 22 by an adhesive layer 26. Materials of the adhesive layer 26 can be liquid adhesive, double sided adhesive tape, or optical adhesive. In a preferred embodiment, the adhesive layer 26 is made of the optical adhesive such as optical clear adhesive (OCA) or optical clear resin (OCR).

The second electrode 23 and the third electrode 25 are respectively attached on two opposite surfaces of the second piezoelectric layer 24. In at least one embodiment, the second piezoelectric layer 24 can be a piezoelectric film made of piezoelectric materials such as polyvinylidene fluoride (PVDF). One surface of the second electrode 23 is attached to the second piezoelectric layer 24, and another surface of the second electrode 23 away from the piezoelectric layer 14 is attached to a second surface of the substrate 22 away from the first piezoelectric layer 21.

In at lease one embodiment, both the second electrode 23 and the third electrode 25 can be made of metal materials having good performance of conductivity. For example, some non-limited examples of the metal materials comprise silver (Ag), aluminum (Al), copper (Cu), nickel (Ni), aurum (Au). In other embodiments, the second electrode 23 and the third electrode 25 can be made of transparent conductive materials. Some non-limited examples of the transparent conductive materials comprise indium tin oxide (ITO), zinc oxide (Zno), poly(3,4-ethylenedioxiythiophene) (PEDOT), carbon nanotude (CNT), Ag nanowire, and graphene.

In addition, the second electrode 23 and the third electrode 25 can be made of different materials. For example, the second electrode 23 is made of metal materials, while the third electrode 25 is made of transparent conductive materials. In another example, the second electrode 23 is made of transparent conductive materials, while the third electrode 25 is made of metal materials. Preferably, both the second electrode 23 and the third electrode 25 are made of silver (Ag).

The second electrode 23 and the third electrode 25 can be respectively attached to the opposite surfaces of the second piezoelectric layer 24 by a vacuum sputtering method, an electroplating method, or a coating method. A preferred method of forming second electrode 23 and the third electrode 25 is the electroplating method. For example, a large area of the both opposite surfaces of the second piezoelectric layer 24 can be electroplated to form two opposite electroplating layers on the two opposite surfaces of the second piezoelectric layer 24. The two electroplating layers formed on the two opposite surfaces of the second piezoelectric layer 24 respectively are the second electrode 23 and the third electrode 25. Each of the second electrode 23 and the third electrode 25 is an ultrathin conductive film having a good sound pressure sensitivity. A thickness of the second electrode 23 and the third electrode 25 is in a range from about 400 angstrom to about 1000 angstrom.

In at least one embodiment, the second electrode 23 and the third electrode 25 are configured to apply voltage to the second piezoelectric layer 24. The second piezoelectric layer 24 serves as a signal sending layer (Tx) and generate sound waves when the voltage is received from the second electrode 23 and the third electrode 25. The sound waves can be ultrasonic waves. When an external object presses or is close to the ultrasonic sensor 2, the ultrasonic waves will arrive at the external object and will be reflected by the external object. The first piezoelectric layer 21 serves as a signal receiving layer (Rx) to receive the ultrasonic waves reflected from the external object, and coverts the ultrasonic waves into electric signals. The electric signals are transmitted to the thin film transistors 221 of the substrate 22. Then, the electric signals are processed by the thin film transistors 221 to realize specific functions such as fingerprint recognition functions of the ultrasonic sensor 2.

In the embodiment, the substrate 22 is different from the traditional TFT glass substrate. The substrate 22 is made of chemically strengthened (CS) glass. For example, the substrate 22 can be made of sodium glass and aluminum silicate glass. The CS glass can be chemically strengthened by a surface finishing process. For example, the glass can be submersed into a bath containing catalyst and a high purity potassium salt (typically potassium nitrate) solution at a high temperature (e.g., 300° C., 420° C., or 450° C.) condition. This causes sodium ions in the glass surface to be replaced by potassium ions from the bath solution to form a strengthened layer on the surface of the glass. In at least one embodiment, the surface compression of the chemically strengthened glass exceeds 200 MPa, and a depth of layer (DOL) of the chemically strengthened glass exceeds five micrometer (μm).

Figure 7:
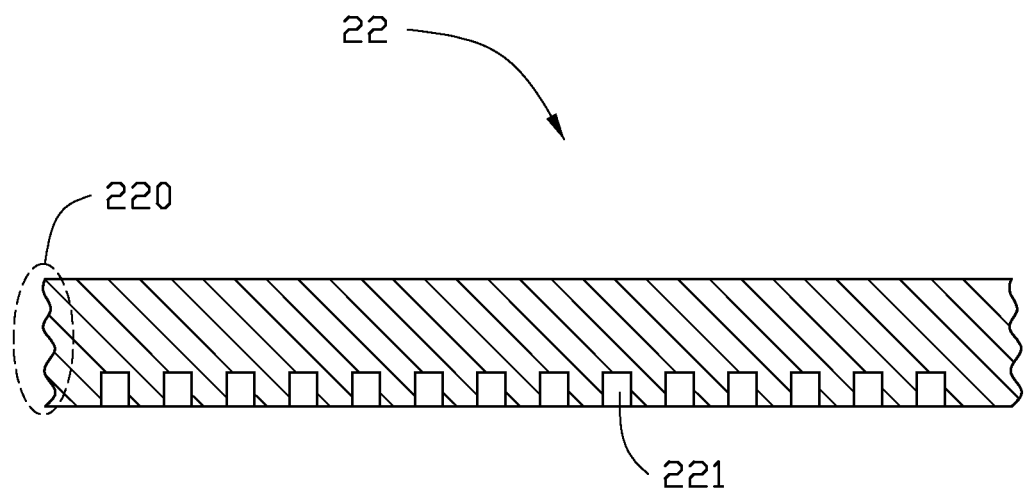
FIG. 7 a cross-sectional view of a substrate of the ultrasonic sensor of FIG. 6 according to a third embodiment.

In addition, the substrate 22 includes at least one microstructure 220 having a plurality of protrusions and concaves. In the embodiment, the substrate 22 includes two microstructures 220 respectively located at two opposite sides of the substrate 22. The microstructures 220 can be formed at the two opposite sides of the substrate 22 by an edge etching (e.g., wet etching or dry etching) process. The microstructure 220 is configured to strengthen a bonding stability between the ultrasonic sensor 2 and the other components. In the embodiment, the microstructure 220 is sawtooth shaped. In another embodiment, as shown in FIG. 7, the microstructure 220 is wave shaped. It should be understood that the microstructure 220 can also be other shapes besides the sawtooth shape and the wave shape.

The ultrasonic sensor 2 further includes an electric connector 27 located on the substrate 22 and configured to couple with an external control circuit (such as flexible printed circuit, FPC). The first electrode 20, the second electrode 23, and the third electrode 25 can be electrically coupled to the external control circuit via the electric connector 27. The external control circuit can supply power to the first electrode 20, the second electrode 23, and the third electrode 25 via the electric connector 27, and can exchange data or signals with the first electrode 20, the second electrode 23, and the third electrode 25 via the electric connector 27.

Further, an encapsulation layer 28 is coated on an external surface of the ultrasonic sensor 27 to encapsulate and protect the ultrasonic sensor 2. In at least one embodiment, the encapsulation layer 28 is formed of adhesive materials, such as glues, resins, optical adhesives, or compound adhesives. A thickness of the encapsulation layer 28 is greater than 10 μm.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. An ultrasonic sensor, comprising a first electrode, a first piezoelectric layer, a substrate, a second electrode, a second piezoelectric layer, and a third electrode, the first electrode and the first piezoelectric layer being stacked on a first surface of the substrate, the second electrode, the second piezoelectric layer, and the third electrode being stacked on a second surface opposite to the first surface of the substrate, wherein the substrate is made of chemically strengthened glass.

2. The ultrasonic sensor according to claim 1, wherein a surface compression of the chemically strengthened glass exceeds 200 MPa.

3. The ultrasonic sensor according to claim 1, wherein a depth of layer (DOL) of the chemically strengthened glass exceeds 5 µm.

4. The ultrasonic sensor according to claim 1, wherein the substrate comprises at least one microstructure having a plurality of protrusions and concaves at a side of the substrate.

5. The ultrasonic sensor according to claim 4, wherein the substrate comprises two microstructures respectively located at two opposite sides of the substrate.

6. The ultrasonic sensor according to claim 5, wherein the microstructures are formed at the two opposite sides of the substrate by an edge etching process.

7. The ultrasonic sensor according to claim 4, wherein the microstructure is sawtooth shaped.

8. The ultrasonic sensor according to claim 4, wherein the microstructure 220 is wave shaped.

9. The ultrasonic sensor according to claim 1, wherein each of the first piezoelectric layer and the second piezoelectric layer is a piezoelectric film made of piezoelectric materials.

10. The ultrasonic sensor according to claim 9, wherein the piezoelectric materials comprise polyvinylidene fluoride (PVDF).

11. The ultrasonic sensor according to claim 1, wherein first piezoelectric layer is attached to the first surface of the substrate by an adhesive layer, and the first electrode is attached to a surface of first piezoelectric layer away from the substrate.

12. The ultrasonic sensor according to claim 1, wherein the second electrode and the third electrode are respectively attached on two opposite surfaces of the second piezoelectric layer, and the second electrode is attached to the second surface of the substrate via an adhesive layer.

13. The ultrasonic sensor according to claim 1, wherein at least one of the first electrode, the second electrode, and the third electrode is made of metal materials.

14. The ultrasonic sensor according to claim 1, wherein at least one of the first electrode, the second electrode, and the third electrode is made of transparent conductive materials.

15. The ultrasonic sensor according to claim 1, wherein a thickness of each of the first electrode, the second electrode, and the third electrode is in a range from about 400 angstrom to about 1000 angstrom.

16. The ultrasonic sensor according to claim 1, wherein an encapsulation layer is coated on an external surface of the ultrasonic sensor to encapsulate and protect the ultrasonic sensor.

17. The ultrasonic sensor according to claim 16, wherein a thickness of the encapsulation layer is greater than 10 µm.

18. The ultrasonic sensor according to claim 1, further comprising an electric connector located on the substrate and configured to connect an external control circuit.

19. The ultrasonic sensor according to claim 1, wherein the first electrode, the second electrode, and the third electrode are electrically connected to the external control circuit via the electric connector.

* * * * *